(12) United States Patent
Maurer et al.

(10) Patent No.: US 6,862,304 B2
(45) Date of Patent: Mar. 1, 2005

(54) LASER DIODE ARRANGEMENT

(75) Inventors: Dieter Maurer, Pfullingen (DE); Rolf Jost, Neckarwestheim (DE); Ulrich Hildebrand, Fellbach (DE); Berry Smutny, Becknang (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/912,201

(22) Filed: Jul. 24, 2001

(65) Prior Publication Data

US 2003/0165172 A1 Sep. 4, 2003

(30) Foreign Application Priority Data

Jul. 26, 2000 (DE) .......................................... 100 36 283

(51) Int. Cl.[7] .............................................. H01S 3/04
(52) U.S. Cl. .......................................... 372/36; 372/34
(58) Field of Search ............................. 372/36, 38, 25, 372/29.01, 29.012, 29.013, 38.02, 74, 38.07, 50, 54, 87, 703, 44, 34, 29.016, 38.09, 38.04, 24.015

(56) References Cited

U.S. PATENT DOCUMENTS

| | | | | |
|---|---|---|---|---|
| 4,011,575 A | * | 3/1977 | Groves | 257/91 |
| 4,298,869 A | * | 11/1981 | Okuno | 345/82 |
| 4,438,347 A | * | 3/1984 | Gehring | 327/511 |
| 4,832,433 A | * | 5/1989 | de La Chapelle et al. | 385/24 |
| 5,287,372 A | * | 2/1994 | Ortiz | 372/38.07 |
| 5,325,384 A | * | 6/1994 | Herb et al. | 372/36 |
| 5,621,225 A | * | 4/1997 | Shieh et al. | 257/81 |
| 5,661,645 A | * | 8/1997 | Hochstein | 363/89 |
| 5,736,881 A | * | 4/1998 | Ortiz | 327/175 |
| 5,751,159 A | * | 5/1998 | Holm et al. | 324/767 |
| 5,780,321 A | * | 7/1998 | Shieh et al. | 438/34 |
| 5,841,648 A | * | 11/1998 | Mansfield | 363/59 |
| 5,883,737 A | * | 3/1999 | Fujikawa et al. | 359/345 |
| 5,909,458 A | * | 6/1999 | Freitas et al. | 372/36 |
| 5,923,692 A | * | 7/1999 | Staskus et al. | 372/50 |
| 5,925,897 A | * | 7/1999 | Oberman | 257/80 |
| 5,936,599 A | * | 8/1999 | Reymond | 345/82 |
| 5,940,683 A | * | 8/1999 | Holm et al. | 438/23 |
| 6,018,602 A | * | 1/2000 | Mayor et al. | 385/27 |
| 6,201,822 B1 | * | 3/2001 | Okayasu | 372/38.04 |
| 6,290,334 B1 | * | 9/2001 | Ishinaga et al. | 347/59 |
| 6,365,429 B1 | * | 4/2002 | Kneissl et al. | 438/46 |
| 6,371,637 B1 | * | 4/2002 | Atchinson et al. | 362/555 |

* cited by examiner

Primary Examiner—Minsun Oh Harvey
Assistant Examiner—Tuan N. Nguyen
(74) Attorney, Agent, or Firm—Michael J. Striker

(57) ABSTRACT

A laser diode arrangement has a joint electrically insulating substrate, a plurality of laser diodes arranged in the joint electrically insulated substrate, conductor structures provided on the substrate so that, the laser diodes are connected with one another through the conductor structures, and a joint control of the laser diodes.

13 Claims, 3 Drawing Sheets

LASER DIODE ARRANGEMENT

BACKGROUND OF THE INVENTION

The present invention relates to a laser diode arrangement with a plurality of laser diodes.

For mounting of pump modules, in particular for Nd-YAG-laser, laser diode bars are utilized, in which the individual laser diodes are connected electrically parallel. U.S. Pat. No. 6,018,602 discloses an optical amplifier with laser diodes for generation of the pump light. The laser diodes are accommodated in individual blocks together with a corresponding control circuit. The blocks are connected with one another in series.

SUMMARY OF THE INVENTION

It is therefore an object of the present invention to provide a laser diode arrangement, which is a further improvement of the existing laser diode arrangements.

In accordance with the present invention, the laser diodes are arranged on a common electrically insulating substrate in series and can be jointly controlled.

This has a particular advantage that a very high efficiency is obtained. In the event of an optical failure of one laser diode, the electric series circuit is not interrupted and the remaining laser diodes remain operational with a high efficiency.

In accordance with the present invention, a joint control of the laser diode arrangement is possible directly from the supply system of a satellite or can be withdrawn from it in a simple manner. The series circuit of the laser diodes guarantees low currents, which makes possible the current supply from a remote source through relatively thin conduits/cables.

In contrast to the solution proposed in the U.S. Pat. No. 6,018,602, the laser diodes are arranged on a joint substrate and have a joint temperature trend. Thereby a temperature regulation can be performed in a simple manner.

In accordance with a further feature of the present invention the substrate has a high thermal conductivity coefficient and a good heat coupling to a support. Thereby the wavelength change of the laser diodes due to the temperature can not operate in a disadvantageous manner.

In accordance with a further embodiment of the present invention, the support can be formed as a cooling body or can be brought with the latter in a thermal contact. Thereby the above mentioned effect is enhanced.

The insulating substrate in accordance with the present invention supports conductive structures, through which the laser diodes are directly connected in series and through which they can be jointly controlled. Depending on the construction of the laser diodes, their electrodes can be contacted directly and/or through bond wires with the conductive structure on the substrate. Also, the circuit connection of the laser diodes, for example with further conductor structures which are arranged on the same support, can be performed through bond wires.

Poor or defective laser diodes can be bridged in a lowohmic way, without negatively influencing the operation of the remaining laser diodes. Advantageously, for this purpose one or several reserve diodes are provided, which are bridged when needed.

In accordance with a further feature of present invention, the operation monitoring of the laser diode arrangement can be performed through a joint monitor diode.

The arrangement in accordance with the present invention is suitable particularly as a reliable pump module for optical communication in space, which reliably operates even in condition of partial failure of individual laser diodes.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF PREFERRED EMBODIMENTS

Figure 1:
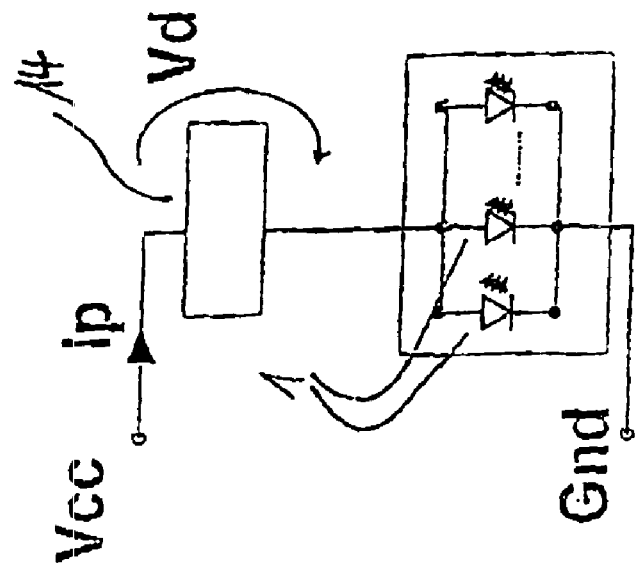
FIG. 1 is a view showing a principle diagram of a conventional pump module with several laser diodes.

FIG. 1 shows a principle diagram for a pump module with laser diodes, wherein the laser diodes 1 are electrically connected in parallel. In this arrangement with a supply voltage $V_{CC}$ of 4 volt, a voltage reserve $V_D$ of 2 volt for a regulating electronic unit 14, and a current Ip LDPM of 9.6 ampere, an efficiency $\eta$ of 50% is obtained.

Figure 2:
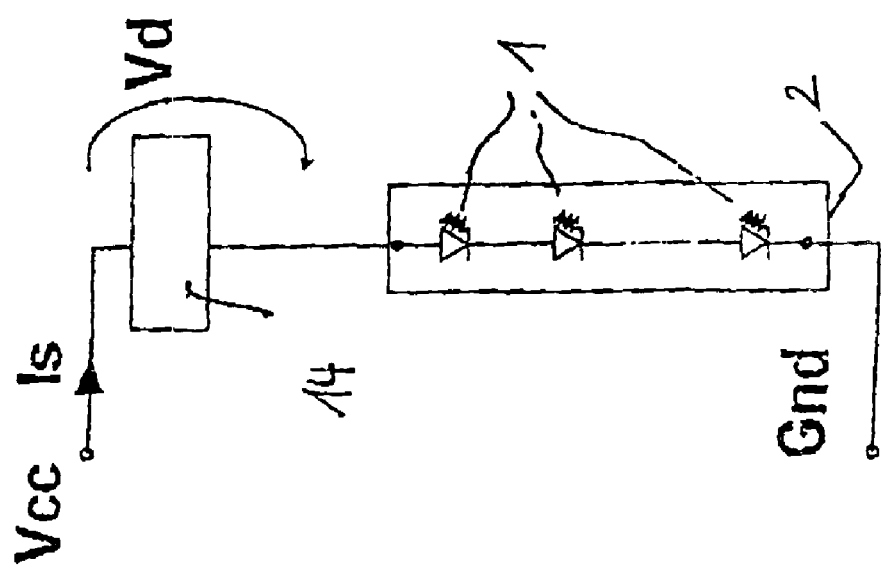
FIG. 2 is a view showing a principle diagram of a laser diode arrangement in accordance with the present invention.

The inventive laser diode invention is shown in FIG. 2. It has for example six laser diodes which are connected in series and controlled jointly. In the inventive laser diode arrangement with a supply voltage $V_{cc}$ of 15 volt, a voltage reserve for the regulating electronic unit 14 $V_d$=2 volt and a current Ip LDPM of 1.6 ampere, an efficiency $\eta$ of 80% is obtained. The voltage of 15 volts and a current of maximum approximately 2 ampere can be made easily available in a satellite. In contrast to the inventive series arrangement, in a parallel arrangement a current of 10 ampere is required. A further important point is that, the series circuit in the case of a failure of one laser diode does not completely fail. Laser diodes have the property that in the case of an optical failure, despite this, electrical operational ability remains. The series circuit is not interrupted by the failed laser diodes.

Figure 3:
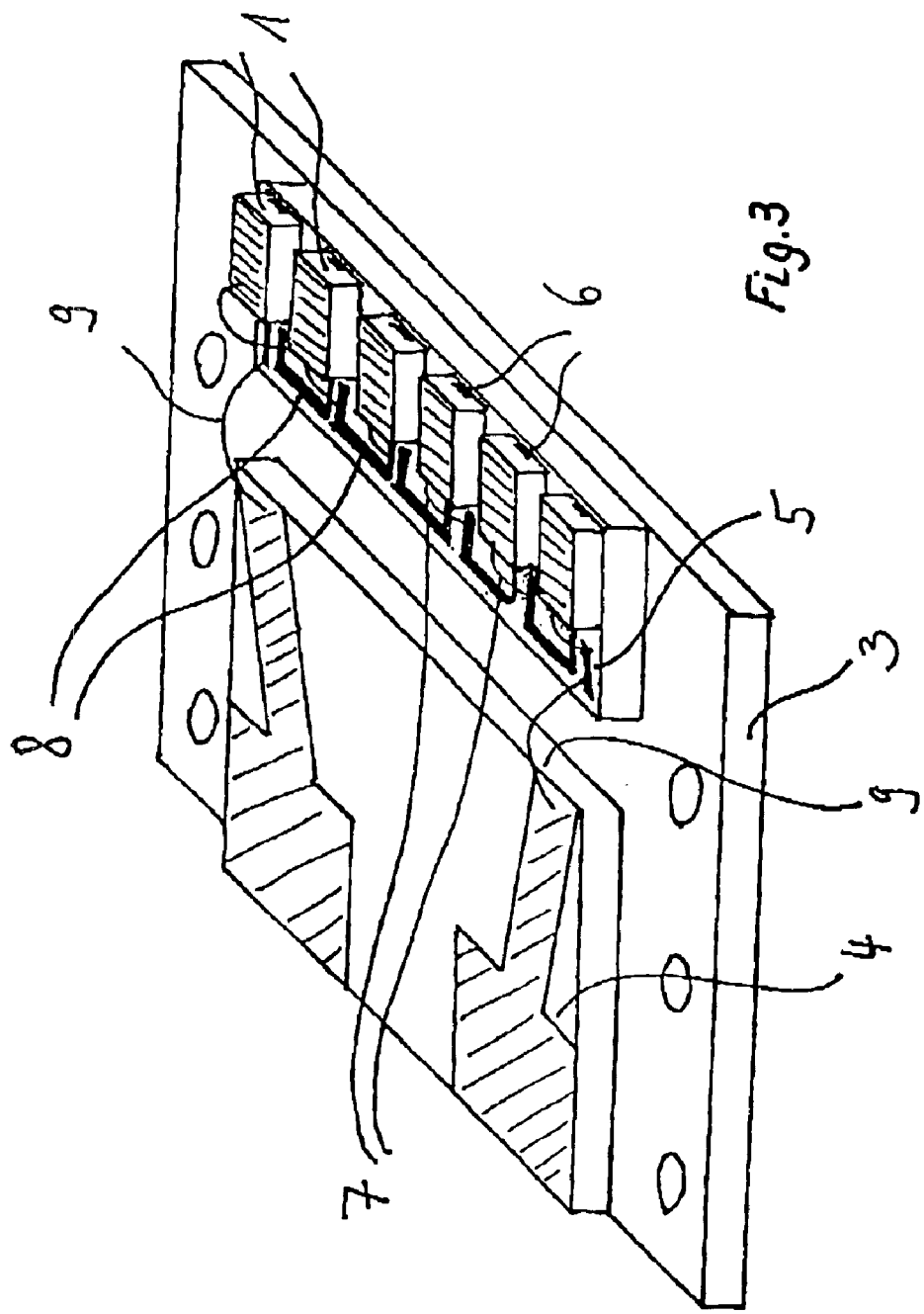
FIG. 3 is a view showing a laser diode arrangement on a joint substrate in accordance with the present invention.

FIG. 3 shows an inventive arrangement of the laser diodes 1 connected in series. The laser diodes 1 are jointly applied on an electrically insulating substrate 2. The substrate 2 is provided with conductor structures 5, through which the individual laser diodes 1 are connected in series with one another.

Each first electrode 6 of a laser diode 1 is directly soldered to the conductor structures 5. The second electrode 7 is also each contacted through a first bond wire 8 with the conductor structures 5. The electrically insulated substrate 2 is applied on a support 3. By providing the substrate 2 with a high thermal conduction coefficient and a good thermal coupling (for this purpose preferably a diamond is suitable) to the support 3, the lost heat of the laser diodes can be efficiently withdrawn, in particular when the carrier 3 is formed as a cooling body or brought with a cooling body in a thermal contact. Further substrates with conductive structure 4 can be applied on the support 3, and formed as pads in FIG. 3. The outer connection of the laser diodes 1 and/or the control unit can be performed through the further substrates with the conductive structures 4, for example via a regulating electronic unit 14. The connection of the conductor structures 4 with the conductor structures 5 can be performed through second bond wires 9.

Figure 4:
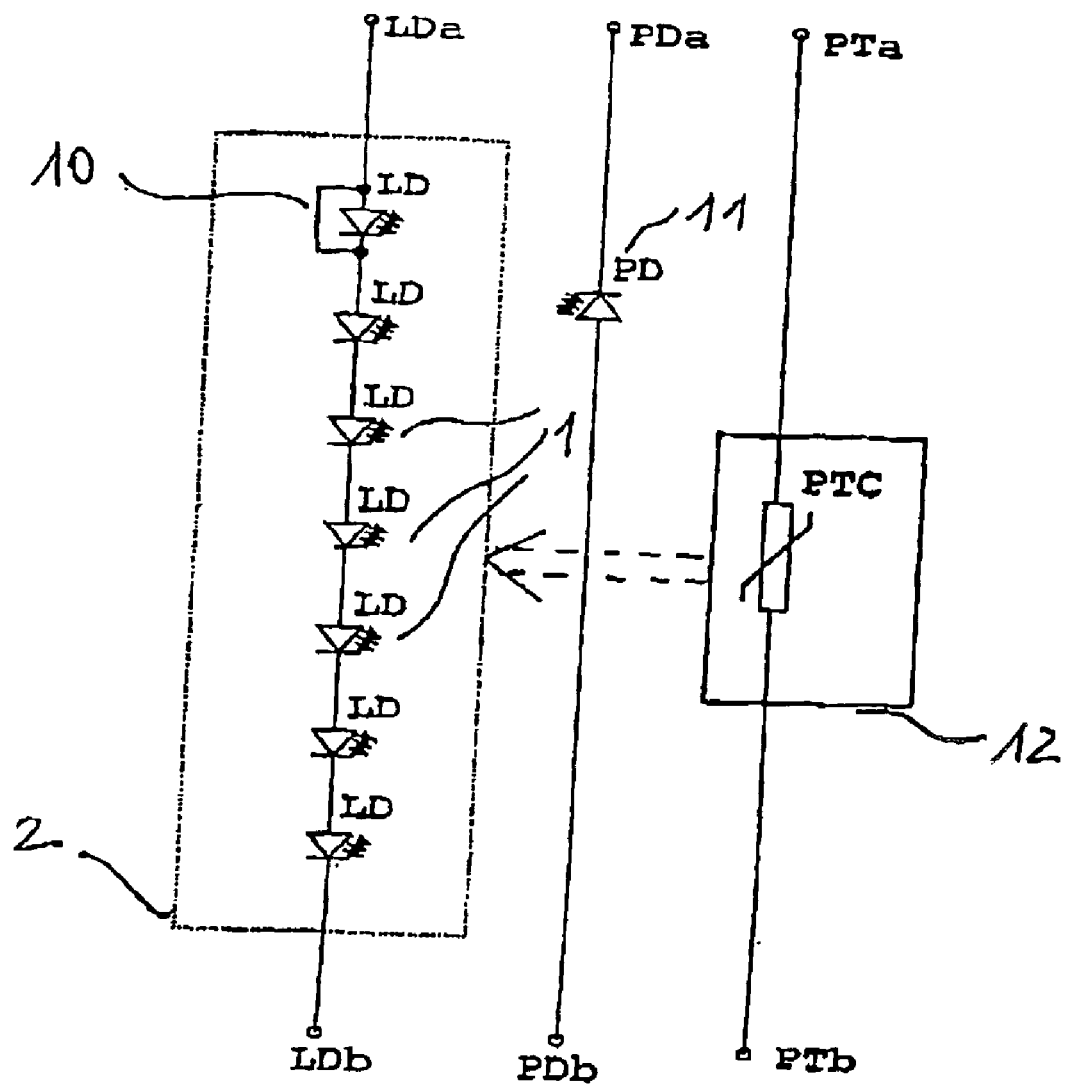
FIG. 4 is a view showing a laser diode arrangement with a monitoring diode and a temperature regulation, in accordance with the present invention.

With mounting of the laser diodes on a support 3 with conductive structures 5, a modular arrangement is provided. It can be preliminarily mounted and compensated, and can be simply connected through bond wires when needed. During the manufacture, for example always one or several laser diode/s (reserve diode/s) can be also provided on the substrate as actually required. A poor or defective laser diode or a not required reserve diode can be simply bridged in a low-ohmic manner through a short circuit bridge 10, as shown in FIG. 4, for example after an inlet test. This increases the yield of usable modules in the manufacture. For example, with this procedure also laser modules applied on a joint substrate can be utilized, when one or several laser diode/s are defective because of the manufacture. If one laser diode fails in operation, the other laser diodes 1 remain, as shown above, nevertheless operational.

As shown in FIG. 4 the whole laser diode arrangement can be monitored with one monitor diode 11 as to its operation. The monitor diode 11 corresponds to the optical output power of the pump laser. The output signal of the monitor diode 11 can be provided for regulation of the current $I_s$ through the laser diodes 1.

A temperature regulating unit 12 is provided for maintaining the wavelength change of the laser diode 1 over the temperature in a predetermined tolerance region. Preferably a PTC resistor is provided as a sensor for the temperature. Depending on the sensor signal a corresponding cooling of the substrate 2 or the support applied on it or a cooling body is performed so that the temperature of the laser diode arrangement remains substantially constant during the operation.

It will be understood that each of the elements described above, or two or more together, may also find a useful application in other types of constructions differing from the types described above.

While the invention has been illustrated and described as embodied in laser diode arrangement, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims;

1. A laser diode arrangement, comprising a joint electrically insulating substrate having high thermal coefficient: a plurality of laser diodes mounted on said joint electrically insulating substrate; conductor structure provided on said electrically insulating substrate and connecting said laser diodes with one another in series; and means for joint control of said laser diodes.

2. A laser diode arrangement as defined in claim 1; and further comprising a support on which said substrate is located, wherein said substrate is composed of a material with high thermal conduction coefficient and a good thermal coupling to said support.

3. A laser diode arrangement as defined in claim 1; and further comprising a support on which said substrate is located, wherein said support is formed as a cooling body.

4. A laser diode arrangement as defined in claim 1; and further comprising a support on which said substrate is located, wherein said support is in a thermal contact with the cooling body.

5. A laser diode arrangement as defined in claim 1, wherein the laser diode arrangement is formed as a pump module for optical communication.

6. A laser diode arrangement as defined in claim 1, wherein said laser diodes have first electrodes which directly contact said conductor structures, said laser diodes also have second electrodes which contact said conductor structures through first bond wires.

7. A laser diode arrangement as defined in claim 6; and further comprising a support on which said substrate is located; and further conductor structures applied on said support and contacting with said first-mentioned conductor structures on said substrate through second bond wires.

8. A laser diode arrangement as defined in claim 1; and further comprising at least one reserve laser diode which is bridgable in a low-ohming way after an inlet test and can replace poor or defective laser diodes.

9. A laser diode arrangement as defined in claim 1; and further comprising a joint monitor diode for operation monitoring of several said laser diodes.

10. A laser diode arrangement as defined in claim 1; and further comprising a temperature regulating unit to maintain a wavelength change of said laser diodes over a temperature in a predetermined tolerance region.

11. A laser diode arrangement as defined in claim 1; and further comprising a source for controlling said laser diodes, said source being formed as a satellite supply voltage source.

12. A laser diode arrangement as defined in claim 1; and further comprising a source for controlling said laser diodes which obtains voltage from a satellite supply voltage.

13. A laser diode arrangement, comprising a joint electrically insulating substrate, a plurality of laser diodes mounted on said joint electrially insulating substrate; conductor structure provided on said electrially insulating substrate and connecting said laser diodes with one another in series; means for joint control of said laser diodes; and short circuit bridges which provide low-ohmic bridging of poor or defective laser diodes.

* * * * *